US006995059B2

(12) United States Patent
Lowrey et al.

(10) Patent No.: US 6,995,059 B2
(45) Date of Patent: Feb. 7, 2006

(54) METHODS OF FORMING CAPACITORS, METHODS OF FORMING CAPACITOR-OVER-BIT LINE MEMORY CIRCUITRY, AND RELATED INTEGRATED CIRCUITRY CONSTRUCTIONS

(75) Inventors: Tyler A. Lowrey, Sandpoint, ID (US); Luan C. Tran, Meridian, ID (US); Alan R. Reinberg, Westport, CT (US); Mark Durcan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 39 days.

(21) Appl. No.: 10/627,468

(22) Filed: Jul. 25, 2003

(65) Prior Publication Data

US 2005/0191819 A1    Sep. 1, 2005

Related U.S. Application Data

(63) Continuation of application No. 09/954,340, filed on Sep. 14, 2001, now Pat. No. 6,599,800, which is a continuation of application No. 09/389,532, filed on Sep. 2, 1999, now Pat. No. 6,312,988.

(51) Int. Cl.
  *H01L 21/8242* (2006.01)
(52) U.S. Cl. .................. 438/254; 438/253; 438/250; 438/396; 438/397; 438/393
(58) Field of Classification Search ........ 438/250–256, 438/393–399
See application file for complete search history.

(56) References Cited

U.S. PATENT DOCUMENTS

| 4,990,980 | A |   | 2/1991  | Wada            |         |
|-----------|---|---|---------|-----------------|---------|
| 5,614,438 | A |   | 3/1997  | Evans, Jr. et al. |       |
| 5,759,893 | A |   | 6/1998  | Wu              |         |
| 5,770,500 | A |   | 6/1998  | Batra et al.    |         |
| 5,793,076 | A |   | 8/1998  | Fazan et al.    |         |
| 5,854,095 | A | * | 12/1998 | Kang et al.     | 438/255 |
| 5,858,831 | A | * | 1/1999  | Sung            | 438/241 |
| 5,858,852 | A | * | 1/1999  | Aiso et al.     | 438/396 |
| 5,866,453 | A | * | 2/1999  | Prall et al.    | 438/253 |
| 5,918,122 | A | * | 6/1999  | Parekh et al.   | 438/253 |
| 5,953,608 | A |   | 9/1999  | Hirota          |         |
| 6,004,859 | A |   | 12/1999 | Lin             |         |
| 6,013,549 | A |   | 1/2000  | Han et al.      |         |
| 6,037,234 | A |   | 3/2000  | Hong et al.     |         |

(Continued)

FOREIGN PATENT DOCUMENTS

DE    195 43 539 C 1    4/1997

(Continued)

OTHER PUBLICATIONS

M. Asakura et al.; "A 34ns 256Mb DRAM with Boosted Sense-Ground Scheme"; IEEE International Solid-State Circuits Conference, 1994; 2 pages.

(Continued)

*Primary Examiner*—Jennifer Kennedy
(74) *Attorney, Agent, or Firm*—Wells St. John, P.S.

(57) ABSTRACT

Methods of forming capacitors, methods of forming capacitor-over-bit line memory circuitry, and related integrated circuitry constructions are described. In one embodiment, a capacitor storage node is formed having an uppermost surface and an overlying insulative material over the uppermost surface. Subsequently, a capacitor dielectric functioning region is formed discrete from the overlying insulative material operably proximate at least a portion of the capacitor storage node. A cell electrode layer is formed over the capacitor dielectric functioning region and the overlying insulative material.

5 Claims, 11 Drawing Sheets

U.S. PATENT DOCUMENTS

| | | | |
|---|---|---|---|
| 6,103,568 | A | 8/2000 | Fujiwara |
| 6,159,818 | A | 12/2000 | Durcan et al. |
| 6,165,840 | A | 12/2000 | Choi et al. |
| 6,184,081 | B1 | 2/2001 | Jeng et al. |
| 6,265,263 | B1 | 7/2001 | Wu |
| 6,274,423 | B1 | 8/2001 | Prall et al. |
| 6,284,591 | B1 | 9/2001 | Lee |
| 6,300,652 | B1 | 10/2001 | Risch et al. |
| 2001/0044181 | A1 | 11/2001 | Nakamura |

FOREIGN PATENT DOCUMENTS

| | | |
|---|---|---|
| DE | 199 07 062 A 1 | 11/1999 |
| EP | 0 901 159 A2 | 10/1999 |
| JP | 411274434 A | 10/1999 |
| WO | WO 96/28844 | 9/1996 |

OTHER PUBLICATIONS

T. Inaba et al.; "A 250mV Bit-Line Swing Scheme for a 1V 4Gb DRAM"; 1995 Symposium on VLSI Circuits Digest of Technical Papers; pp. 99-100.

Takeshi Hamamoto et al.; "Cell-Plate-Line and Bit-Line Complemetarily Sensed (CBCS) Architecture for Ultra Low-Power Non-Destructive DRAMs"; 1995 Symposium on VLSI Circuits Digest of Technical Papers; pp. 79-80.

Mikio Asakura et al.; "Cell-Plate Line Connecting Complementary Bit Line ($C^3$) Architecture for Battery Operating DRAMS"; LSI Research and Development Laboratory; undated; pp. 59-60.

Mikio Asakura et al.; "Cell-Plate Line Connecting Complementary Bit-Line ($C^3$) Architecture for Battery-Operating DRAM's"; IEEE Journal of Solid-State Circuits, vol. 27, No. 4, Apr. 1992; pp. 597-602.

Satoshi Shinozaki; "DRAMS in the 21st Century"; 1996 IEDM Short Course; 5 pages.

Nicky Chau-Chun Lu et al.; "Hal-$V_{DD}$ Bit-Line Sensing Scheme in CMOS Dram's"; IEEE Solid-State Circuits, vol. SC-19, No. 4, Aug. 1994; pp. 451-454.

* cited by examiner

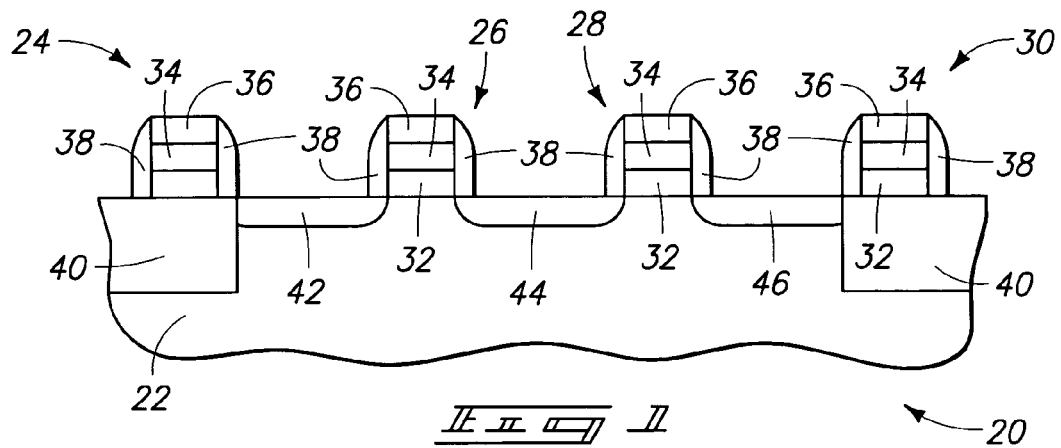
_FIG. 1_
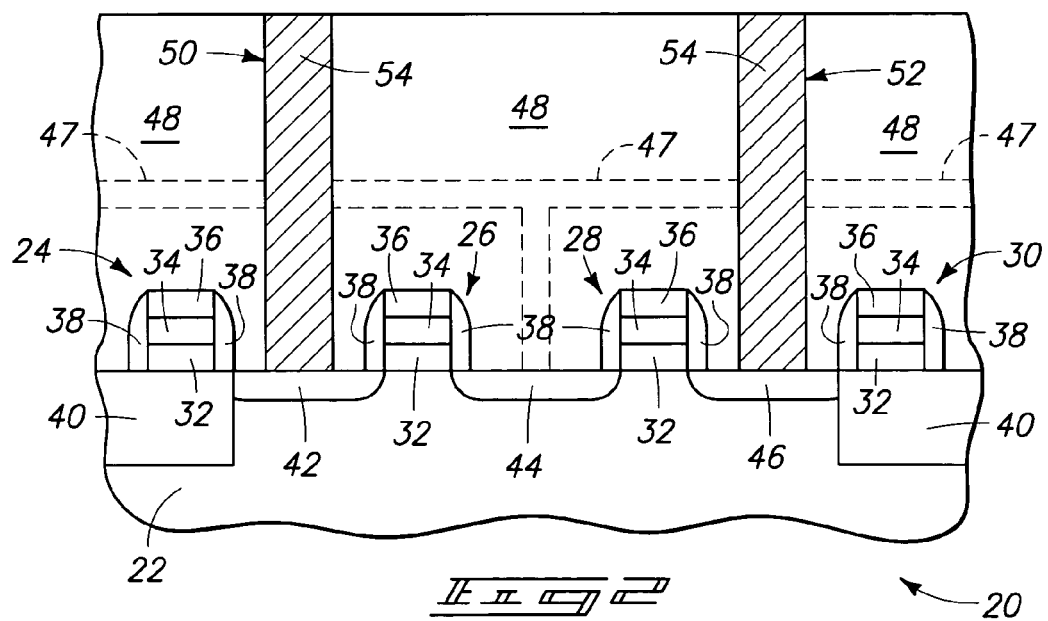
_FIG. 2_

METHODS OF FORMING CAPACITORS, METHODS OF FORMING CAPACITOR-OVER-BIT LINE MEMORY CIRCUITRY, AND RELATED INTEGRATED CIRCUITRY CONSTRUCTIONS

CROSS REFERENCE TO RELATED APPLICATION

This patent application is a Continuation Application of U.S. patent application Ser. No. 09/954,340 filed Sep. 14, 2001, now U.S. Pat. No. 6,599,800 which issued Jul. 29, 2003, entitled "Methods of Forming Capacitors, Methods of Forming Capacitor-Over-Bit Line Memory Circuitry, and Related Integrated Circuitry Constructions," naming Tyler A. Lowrey, Luan C. Tran, Alan R. Reinberg, and D. Mark Durcan as inventors, which is a Continuation of U.S. patent application Ser. No. 09/389,532 filed Sep. 2, 1999, now U.S. Pat. No. 6,312,988 which issued Nov. 6, 2001, the disclosures of which are incorporated herein by reference.

TECHNICAL FIELD

This invention relates to methods of forming capacitors, to methods of forming capacitor-over-bit line memory circuitry, and to related integrated circuitry constructions.

BACKGROUND OF THE INVENTION

As integrated circuitry continues to shrink in size, efforts are ongoing to find novel methods of forming integrated circuitry structures and related integrated circuitry which improve upon those methods currently utilized and the resultant structures formed thereby.

One type of integrated circuitry is memory circuitry. Such circuitry has been and continues to be the focus of intense efforts to reduce the size of the circuitry, increase the speed with which such circuitry operates, and maintain or increase the ability of such circuitry to perform its memory function.

Accordingly, this invention arose out of concerns associated with improving the methods by which integrated circuitry, and in particular, integrated memory circuitry is formed. This invention also arose out of concerns associated with providing improved integrated circuitry constructions.

SUMMARY OF THE INVENTION

Methods of forming capacitors, methods of forming capacitor-over-bit line memory circuitry, and related integrated circuitry constructions are described. In one embodiment, a capacitor storage node is formed having an uppermost surface and an overlying insulative material over the uppermost surface. Subsequently, a capacitor dielectric functioning region is formed discrete from the overlying insulative material operably proximate at least a portion of the capacitor storage node. A cell electrode layer is formed over the capacitor dielectric functioning region and the overlying insulative material. In another embodiment, a capacitor storage node is formed having an uppermost surface and a side surface joined therewith. A protective cap is formed over the uppermost surface and a capacitor dielectric layer is formed over the side surface and protective cap. A cell electrode layer is formed over the side surface of the capacitor storage node. In yet another embodiment, a plurality of capacitor storage nodes are formed arranged in columns. A common cell electrode layer is formed over the plurality of capacitor storage nodes. Cell electrode layer material is removed from between the columns and isolates individual cell electrodes over individual respective capacitor storage nodes. After the removing of the cell electrode layer material, conductive material is formed over portions of remaining cell electrode material thereby placing some of the individual cell electrodes into electrical communication with one another.

BRIEF DESCRIPTION OF THE DRAWINGS

Preferred embodiments of the invention are described below with reference to the following accompanying drawings.

FIG. 1 is a diagrammatic side sectional view of a semiconductor wafer fragment in process in accordance with one embodiment of the present invention.

FIG. 2 is a view of the FIG. 1 wafer fragment at a processing step which is subsequent to that which is shown in FIG. 1.

DETAILED DESCRIPTION OF THE PREFERRED EMBODIMENTS

Figure 3:
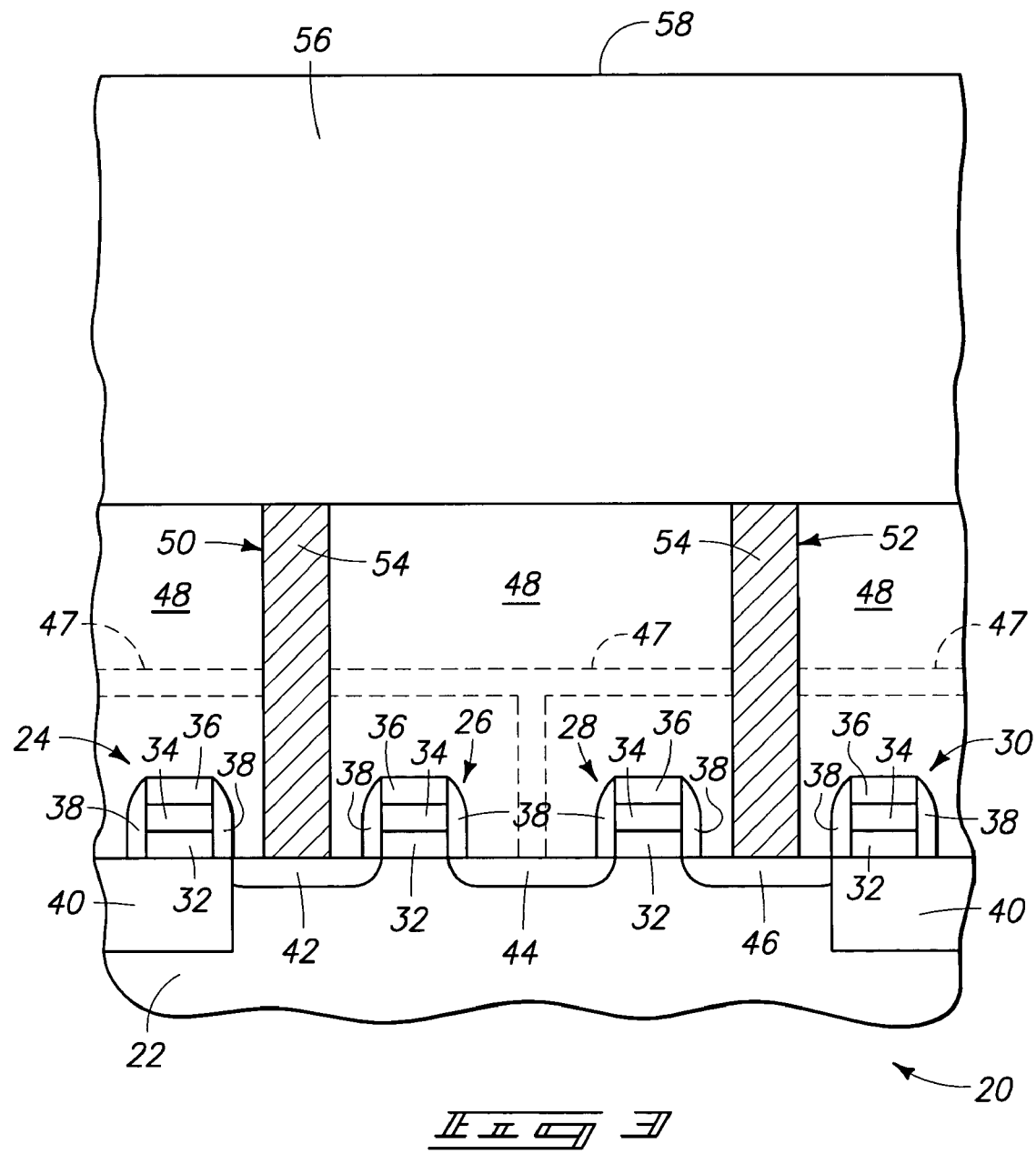
FIG. 3 is a view of the FIG. 1 wafer fragment at a processing step which is subsequent to that which is shown in FIG. 2.

This disclosure of the invention is submitted in furtherance of the constitutional purposes of the U.S. Patent Laws "to promote the progress of science and useful arts" (Article 1, Section 8).

Referring to FIG. 1, a semiconductor wafer fragment in process is shown generally at 20 and comprises semiconductive substrate 22. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Conductive lines 24, 26, 28, and 30 are formed over substrate 22 and include a gate oxide layer (not specifically shown), a conductive polysilicon layer 32, a silicide layer 34, an insulative cap 36, and sidewall spacers 38. Other conductive line constructions can, of course, be used. Shallow isolation trenches 40 are provided and are backfilled with dielectric material and are planarized. Isolation regions 40 can also be provided through other techniques such as field oxide isolation techniques. Diffusion regions 42, 44, and 46 are formed within substrate 22 intermediate respective conductive lines. The diffusion regions typically comprise regions of the substrate which are implanted with suitable impurities.

Referring to FIG. 2, a buried digit line 47 is formed and is encapsulated in an insulative layer such as borophosphosilicate glass (BPSG) 48 that is formed over substrate 22. Openings 50, 52 are formed in the insulative layer 48. The openings are formed over and join with respective diffusion regions 42, 46. Conductive material 54, e.g. conductively doped polysilicon, is formed over the substrate and within opening 50, 52. The buried digit line 47 is shown as a dashed line to emphasize that the buried digit line does not connect to (e.g., is behind, or is below the plane of FIG. 2) the conductive material 54 formed in the openings 50 and 52. Conductive material 54 can be subsequently planarized for isolation purposes. Conductive material 54 establishes electrical communication with the respective diffusion regions over which it is formed and will provide electrical communication between capacitor storage nodes which are to be formed as described below.

Referring to FIG. 3, a layer of material 56 is formed over substrate 22 and has a generally planar outer surface 58. For purposes of the ongoing discussion, layer 56 comprises a first insulative layer of material. An exemplary material is BPSG.

Figure 4:
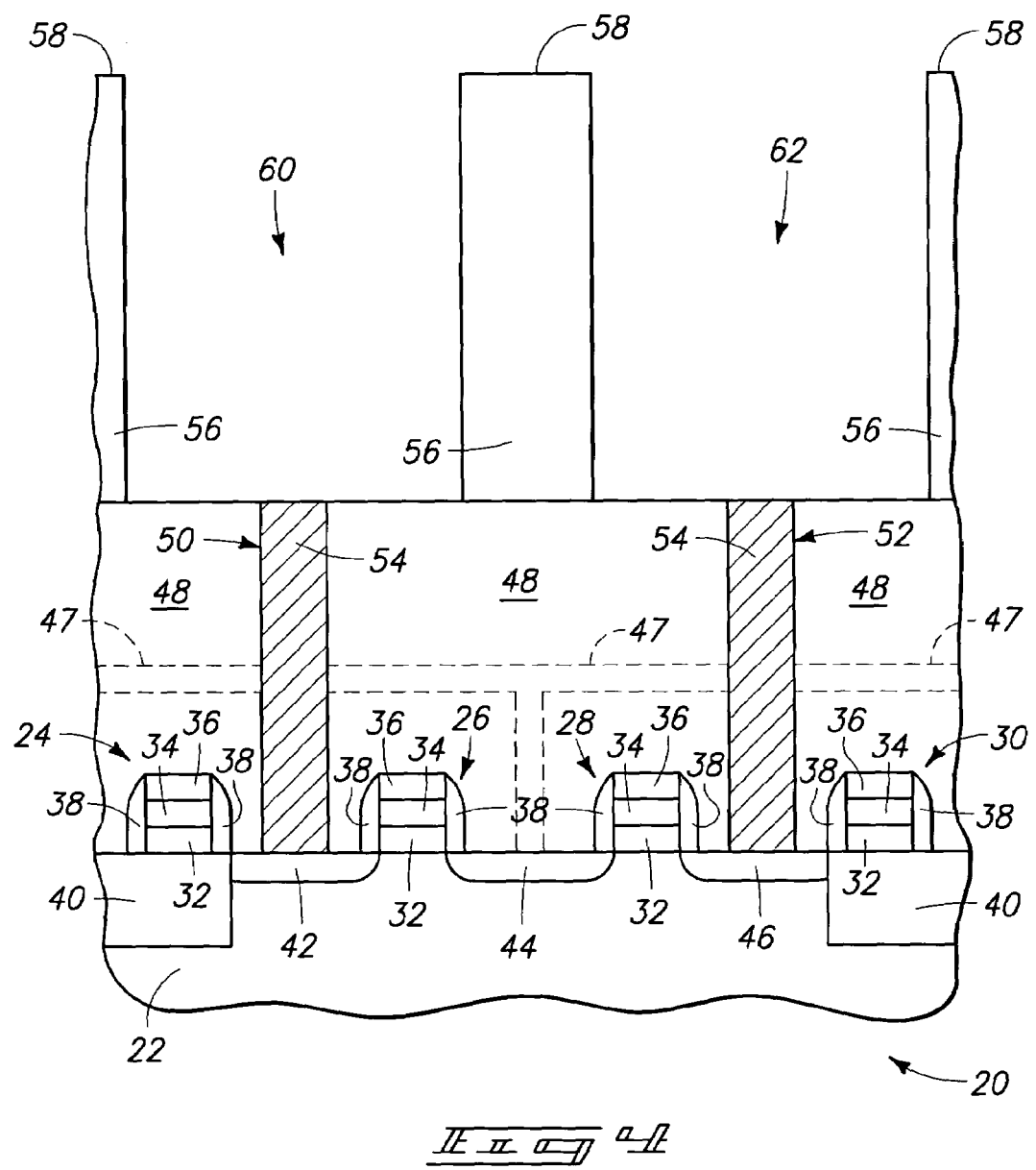
FIG. 4 is a view of the FIG. 1 wafer fragment at a processing step which is subsequent to that which is shown in FIG. 3.

Referring to FIG. 4, a plurality of openings are formed over or within layer 56, with exemplary openings being shown at 60, 62. In the illustrated and preferred embodiment, opening 60, 62 are formed to expose uppermost portions of conductive material 54.

Figure 5:
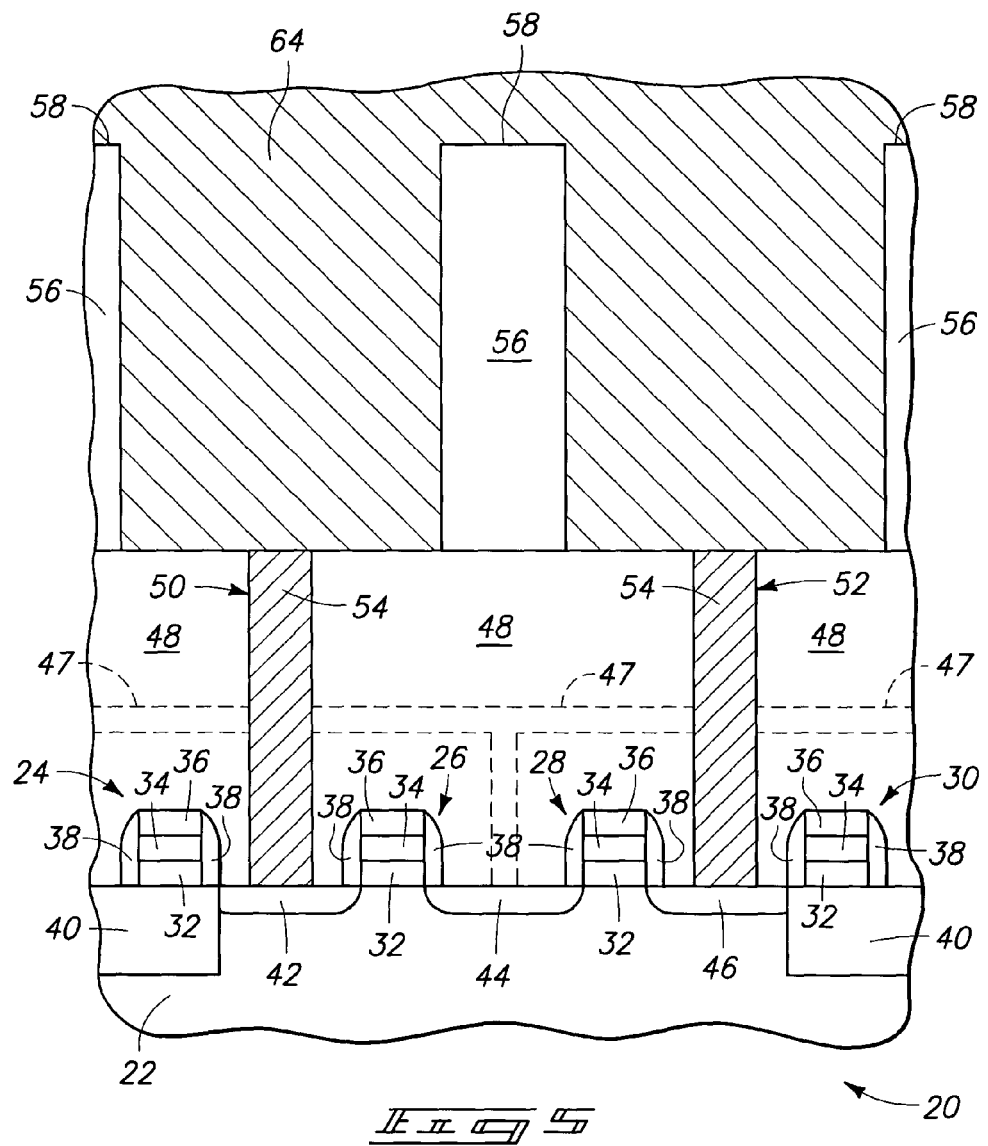
FIG. 5 is a view of the FIG. 1 wafer fragment at a processing step which is subsequent to that which is shown in FIG. 4.

Referring to FIG. 5, conductive material 64 is formed over substrate 22 and received within openings 60, 62. In the illustrated example, conductive material 64 is formed sufficiently to overfill the openings. It is possible, however, to only partially fill or underfill the openings for purposes which will become apparent below.

Figure 6:
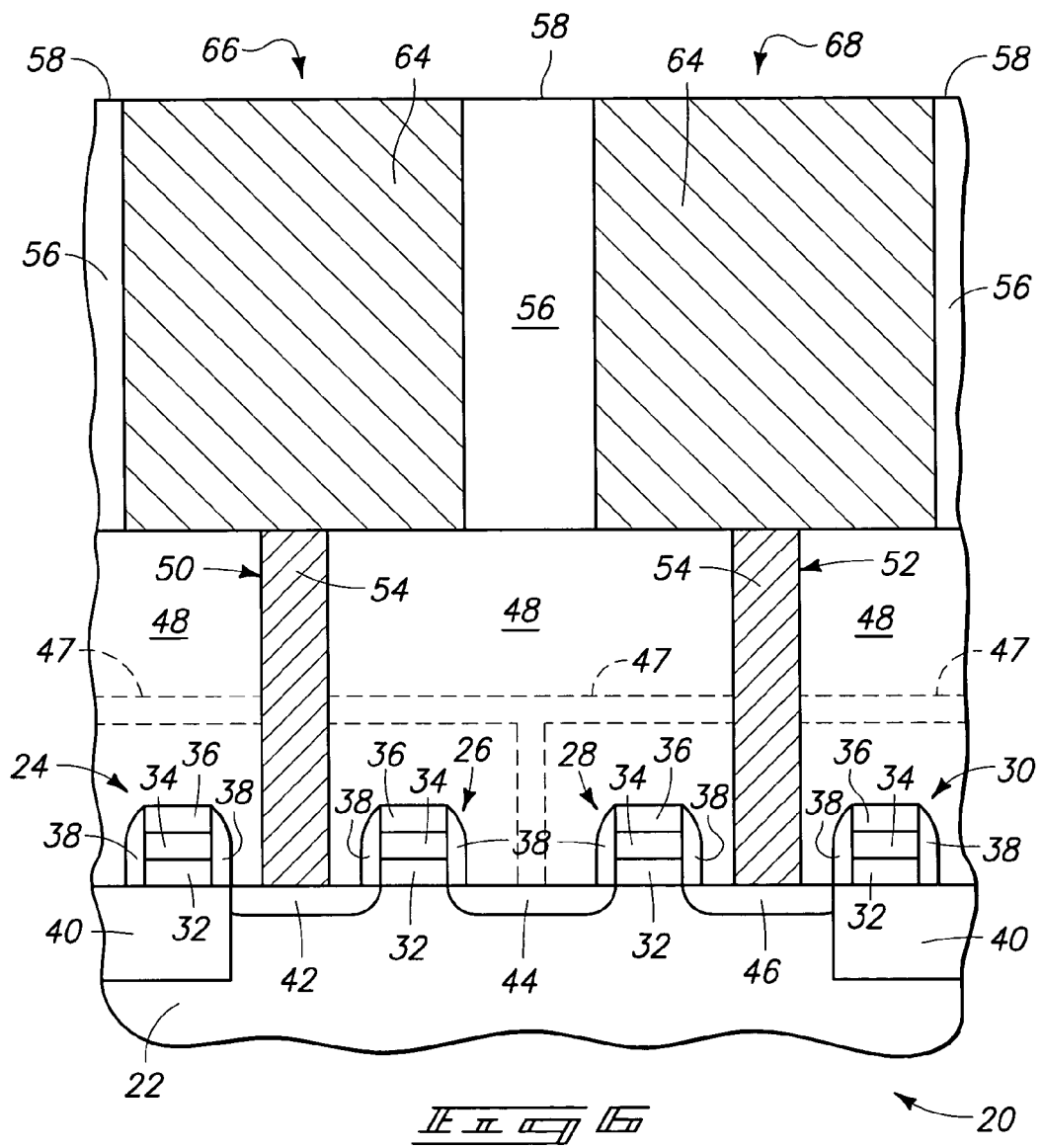
FIG. 6 is a view of the FIG. 1 wafer fragment at a processing step which is subsequent to that which is shown in FIG. 5.

Referring to FIG. 6, portions of conductive material 64 are removed, as by planarization or other methods, to electrically isolate the conductive material within the openings formed within and laterally adjacent insulative layer 56. Such forms, in one embodiment, a plurality of capacitor storage nodes. Exemplary storage nodes are shown at 66, 68. The storage nodes, as formed, are arranged in columns which are disposed into and out of the plane of the page upon which FIG. 6 appears. Specifically, in this example storage node 66 constitutes one of a plurality of storage nodes arranged in one column which extends into and out of the plane of the page; and, storage node 68 constitutes one of a plurality of storage nodes in a different column which extends into and out of the plane of the page. Each column constitutes an array of storage nodes. The storage nodes can also be formed as containers or cup-like structures, with subsequent processing taking place substantially as described below.

Figure 7:
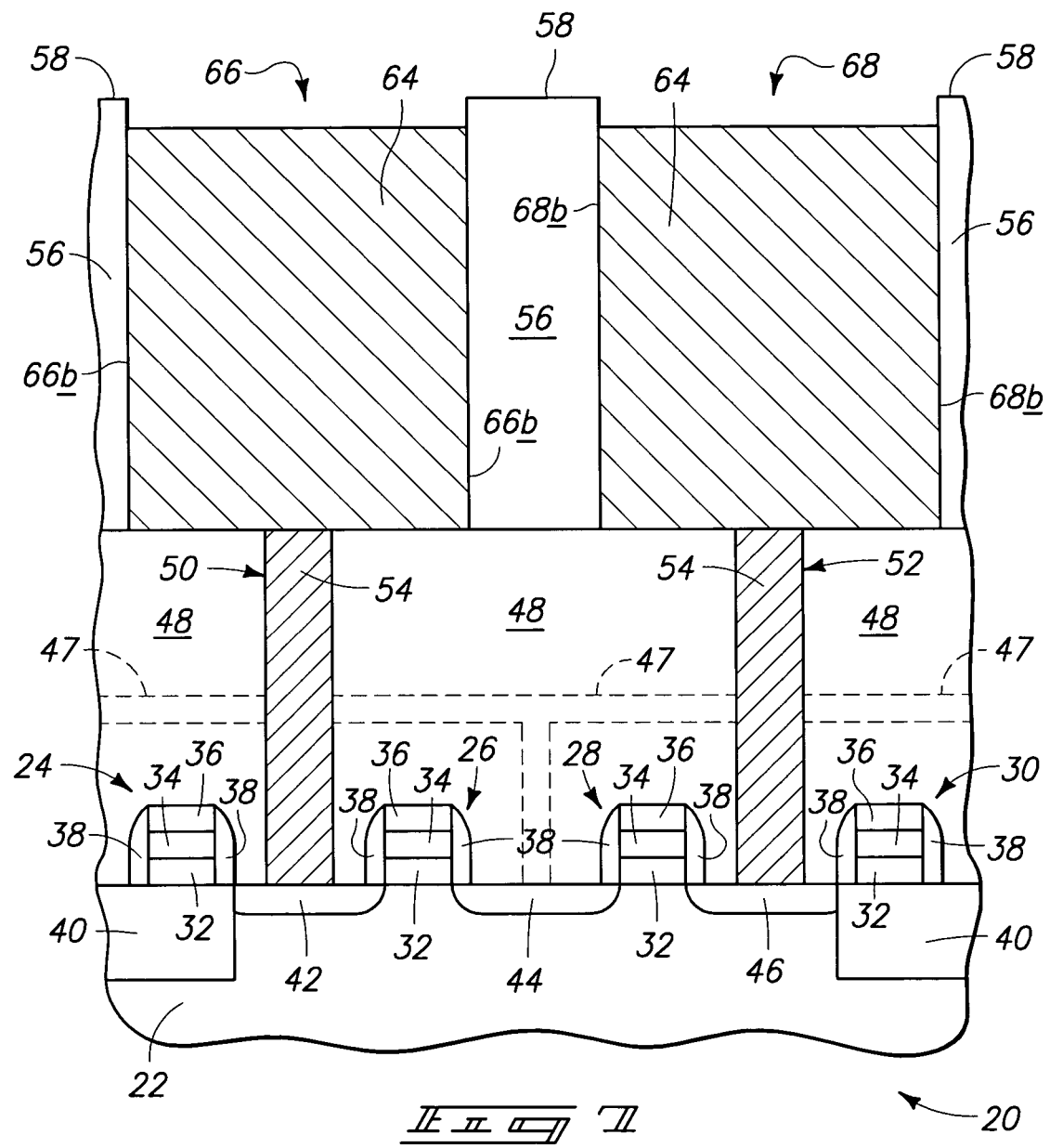
FIG. 7 is a view of the FIG. 1 wafer fragment at a processing step which is subsequent to that which is shown in FIG. 6.

Referring to FIG. 7, portions of conductive material 64 are removed sufficiently to less than fill each opening 66, 68 respectively. Accordingly, such constitutes but one way in which each opening can be less than filled with conductive material. It is possible, as mentioned above, for each opening to be less than filled with conductive material by other techniques. For example, a conformal deposition of conductive material, e.g. polysilicon, can be conducted to less than fill the openings.

In this example, overfilled portions of conductive material 64 are removed to below outer surface 58 of first insulative material layer 56, thereby partially filling each respective opening. Accordingly, each storage node received within layer 56 has an upper surface 66a, 68a respectively, which is disposed elevationally below outer surface 58. The illustrated upper surfaces 66a, 68a constitute uppermost surfaces, and each storage node has a side surface 66b, 68b respectively joined with its associated uppermost surface.

Figure 8:
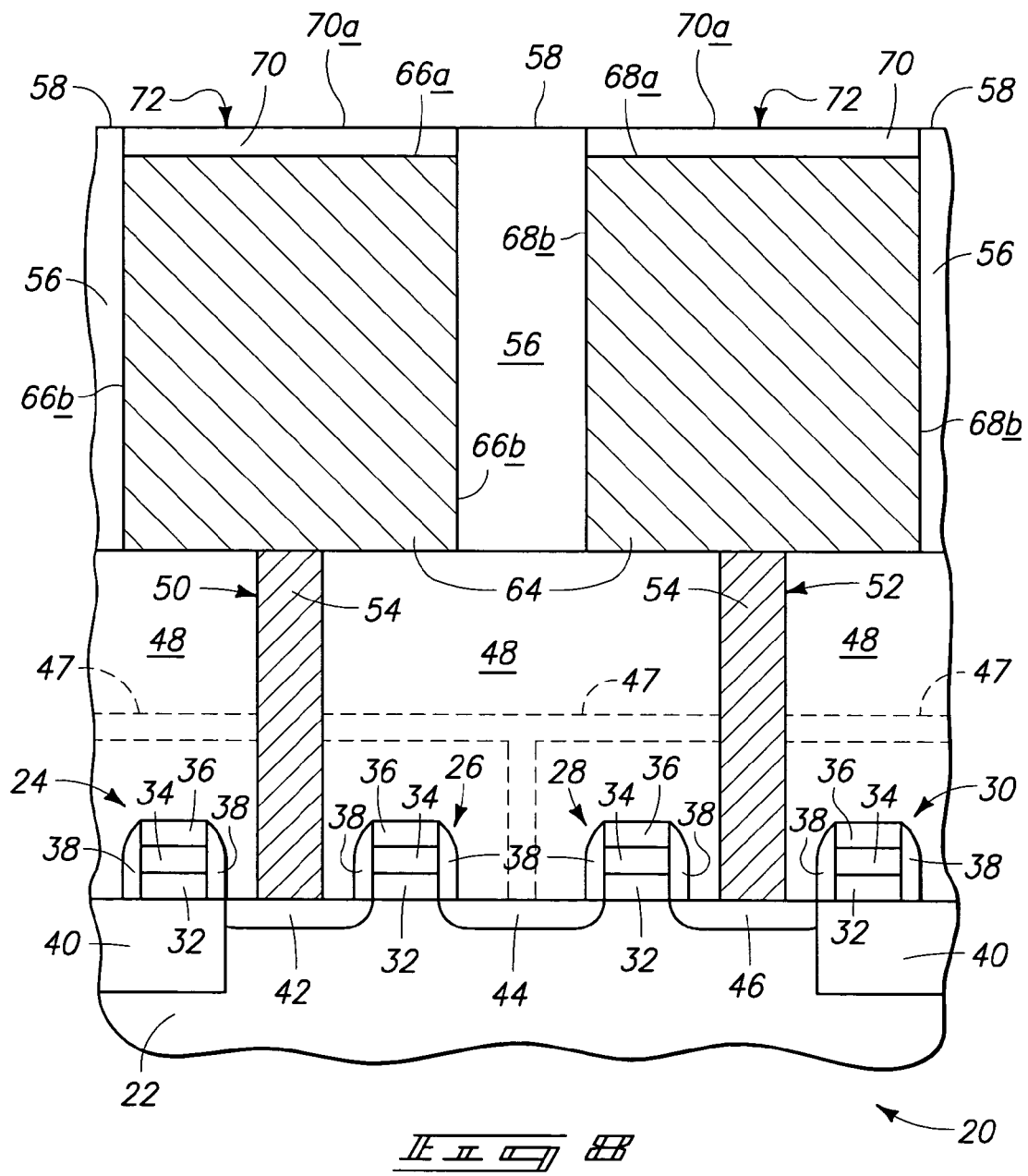
FIG. 8 is a view of the FIG. 1 wafer fragment at a processing step which is subsequent to that which is shown in FIG. 7.

Referring to FIG. 8, an overlying insulative material 70 is formed over the uppermost surfaces 66a, 68b of respective storage nodes 66, 68. In the illustrated example, the formation of insulative material 70 constitutes filling remaining opening portions with insulative material. Insulative material 70 is preferably different from material comprising layer 56 for reasons which will become apparent below. An exemplary material is an oxide formed through decomposition of TEOS. In this example and for purposes of the ongoing discussion, insulative material 70 comprises a second different insulative layer of material, at least a portion of which is disposed within remaining opening portions. Such material can be formed by overfilling the remaining opening portions and planarizing the material relative to outer surface 58 of layer 56. Alternately by way of example only, the layer can be etched back through a timed etch.

In one embodiment, a sufficient amount of insulative material is formed over each storage node such that an insulative material surface 70a is generally coplanar with generally planar outer surface 58.

Alternately considered, protective caps 72 are formed over uppermost surfaces 66a, 68a, with each cap being formed within at least a remaining portion of each opening. The protective caps are insulative in nature and formed over, and in this example, not laterally proximate conductive material comprising each storage node.

Figure 9:
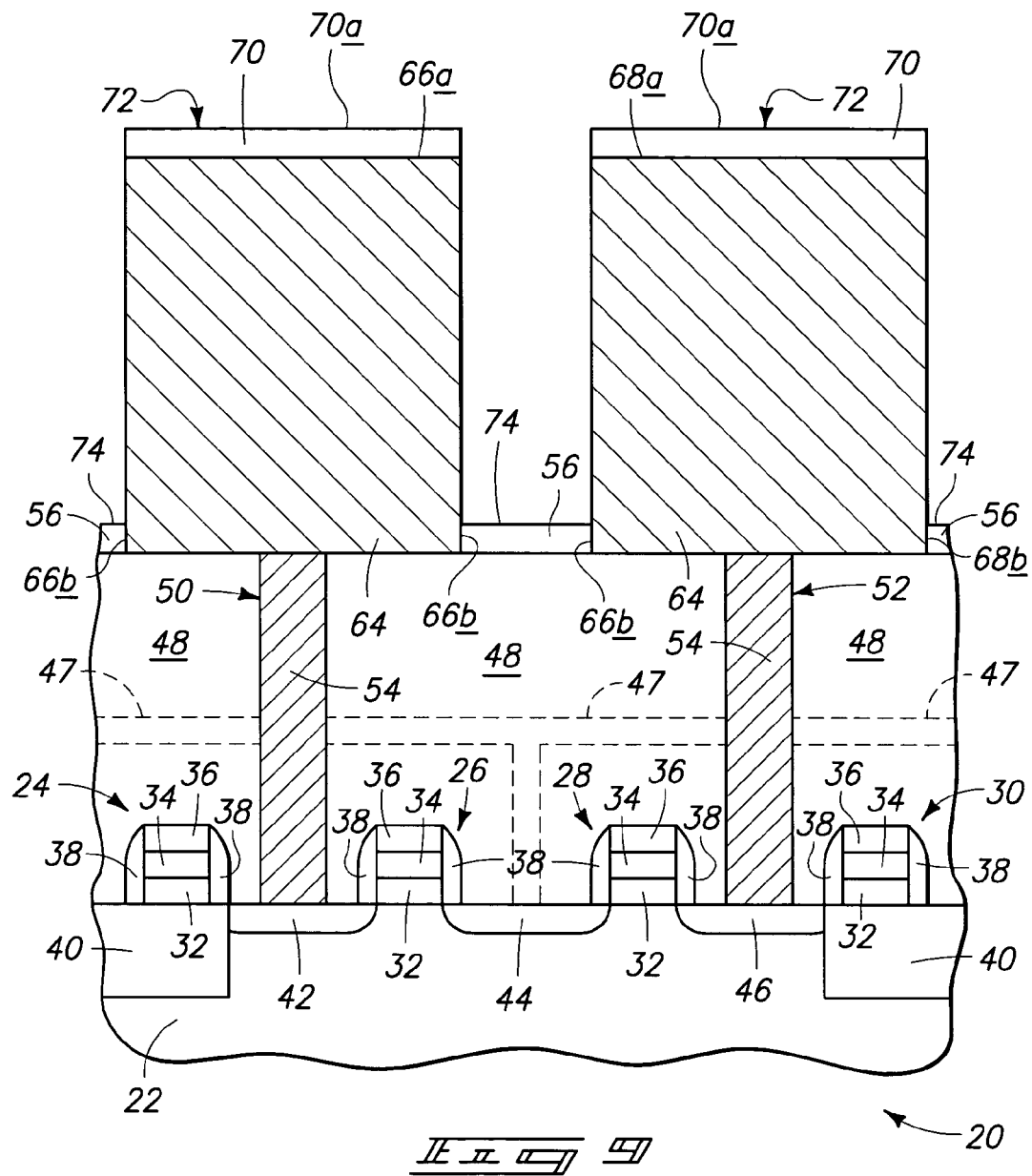
FIG. 9 is a view of the FIG. 1 wafer fragment at a processing step which is subsequent to that which is shown in FIG. 8.

Referring to FIG. 9, portions of first insulative material layer 56 are removed to expose portions of side surfaces 66b, 68b respectively. In one embodiment, material of layer 56 is etched selectively relative to insulative material 70. Such constitutes removing material which is laterally adjacent each storage node sufficiently to expose respective side portions thereof. In this example, storage node portions are partially exposed by the removal of material of layer 56. Accordingly, side surfaces 66b, 68b have respective first portions (undesignated) which are disposed elevationally higher than an adjacent insulative material upper surface 74, and respective second portions (undesignated) which are disposed elevationally lower than the adjacent insulative material upper surface 74. In another embodiment, the removal of material of layer 56 comprises etching such material faster than any of second insulative material 70 sufficiently to expose portions of each capacitor node.

Figure 10:
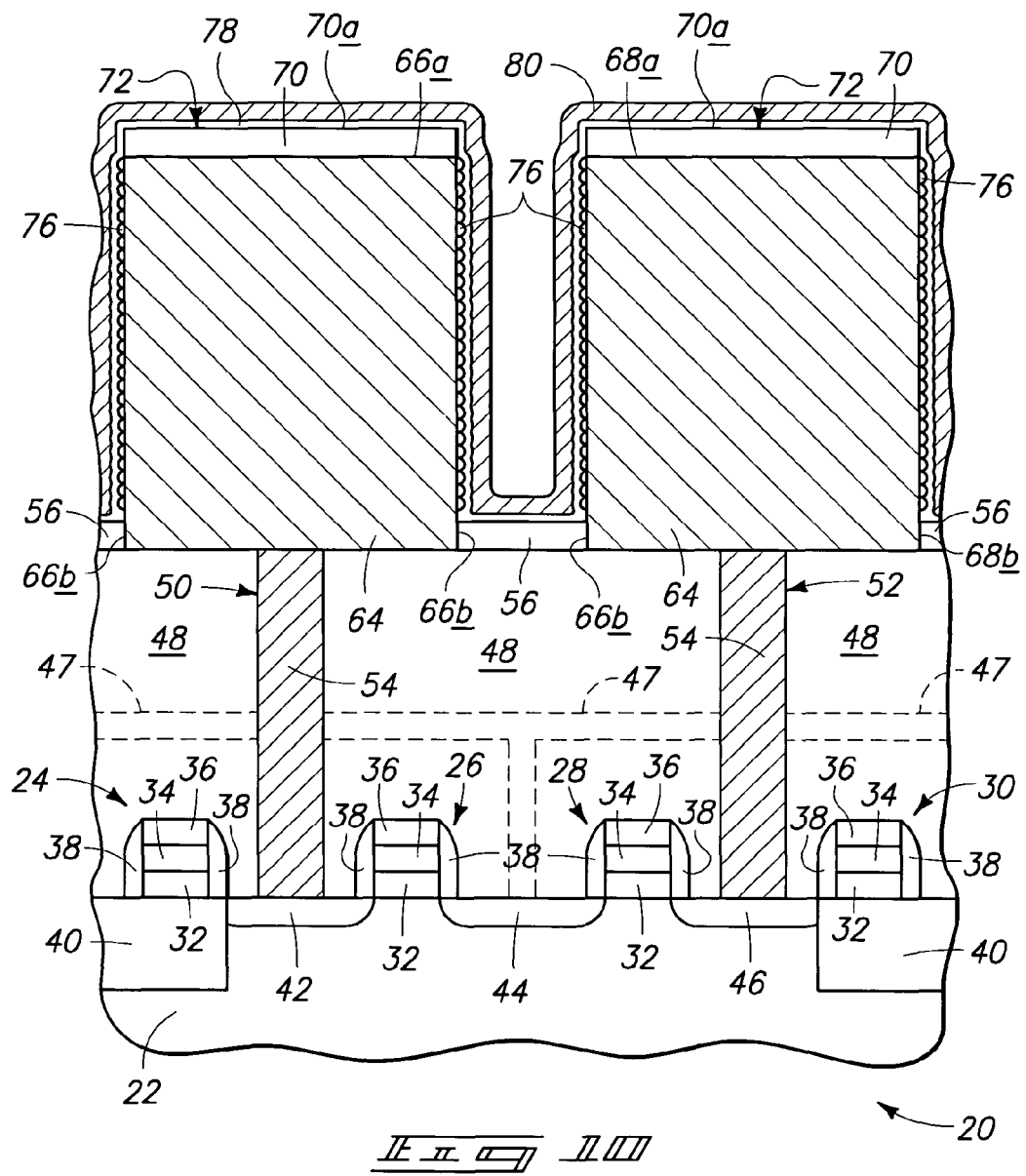
FIG. 10 is a view of the FIG. 1 wafer fragment at a processing step which is subsequent to that which is shown in FIG. 9.

Referring to FIG. 10, a layer of roughened polysilicon 76, e.g. hemispherical grain (HSG) polysilicon or cylindrical grain polysilicon, is formed over exposed portions of each storage node. A capacitor dielectric layer 78 is formed over the exposed side surfaces of each storage node and corresponding portions of each node's protective cap 72. Such forms capacitor dielectric functioning regions which are discrete from the overlying insulative material 70 operably proximate at least a portion of the capacitor storage node.

A common cell electrode layer 80 is formed over capacitor dielectric layer 78, insulative material 70, and the previously-exposed side surfaces of the storage nodes. In this example, layer 80 is formed laterally proximate the respective side surface first portions which were previously exposed. Alternately considered, the array of storage nodes is first electrically interconnected in a capacitor array configuration with common cell electrode layer 80.

Figure 11:
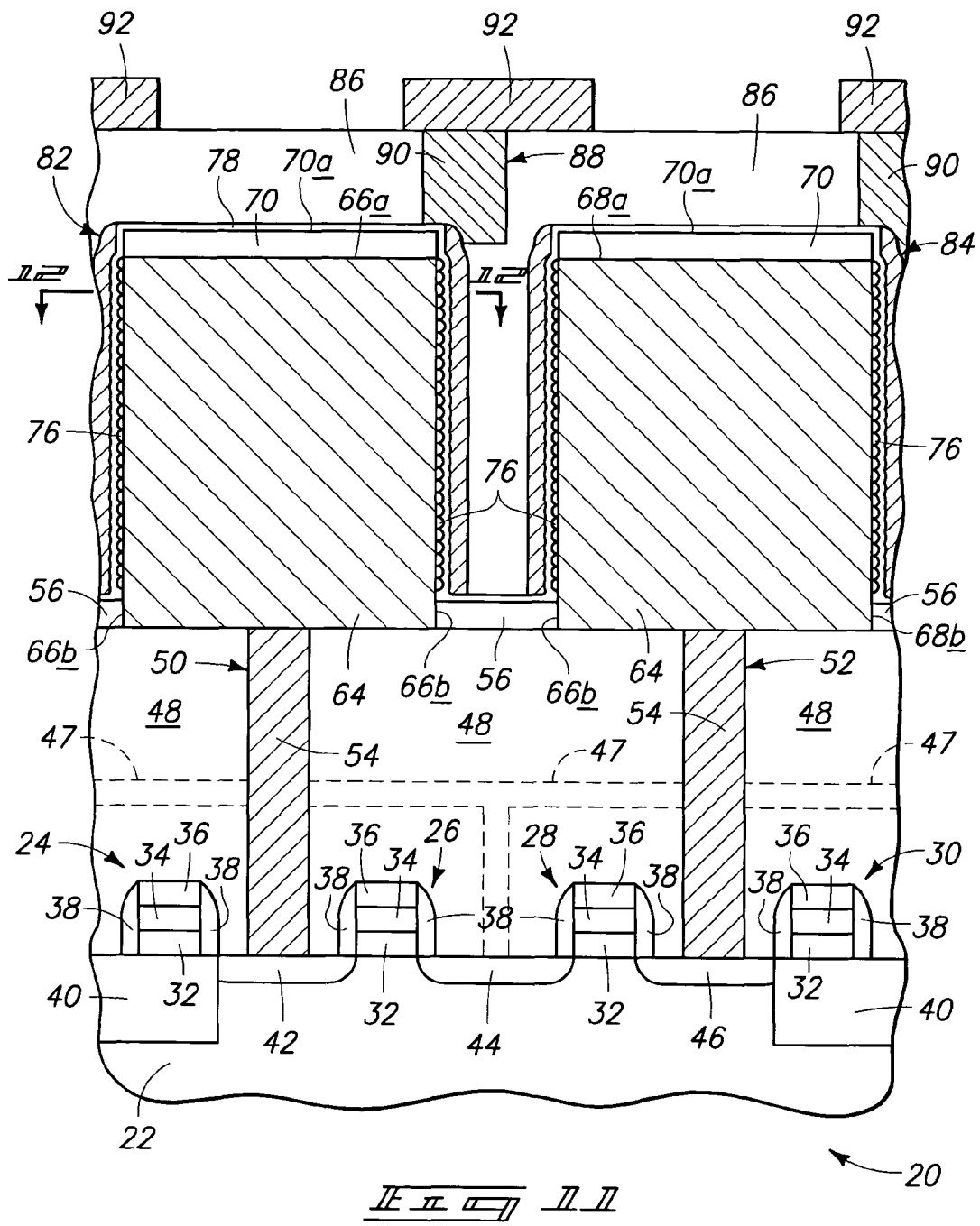
FIG. 11 is a view of the FIG. 1 wafer fragment at a processing step which is subsequent to that which is shown in FIG. 10.

Referring to FIG. 11, a number of processing steps have taken place. First, material of common cell electrode layer 80 has been removed from between the columns defined by each of the respective storage nodes. Common cell electrode layer material is also preferably removed from over the individual protective caps. In one embodiment, cell electrode material is left only over generally vertical surfaces. Such serves to isolate individual cell electrodes over their respective capacitor storage nodes. In one embodiment, the removal of material of the common cell electrode layer 80 comprises anisotropically etching such layer and forming individual bands or rings 82, 84 around the node portions which were previously exposed. Overlying insulative layer 70 provides protection during the removal of the material of cell electrode layer 80 so that the risk of exposure and removal of layer 78 adjacent polysilicon 76 can be greatly reduced if not eliminated. In turn, subsequent risks of shorting between the cell plate and storage node can be greatly reduced if not eliminated. In a preferred embodiment, such bands are also formed over portions of the protective caps as shown. In a preferred embodiment, such is accomplished through a maskless etch. In the context of this document, the term "maskless" will be understood to only mean no masking of the area of the layer being etched for purposes of isolating the layer, without requiring no masking of the layer elsewhere on the substrate.

A third insulative material 86 is formed over the substrate including the isolated cell electrodes or bands 82, 84. An exemplary material is BPSG. Such material is formed over remaining cell electrode material. Openings 88 are patterned and etched into layer 86, and preferably expose at least some of the remaining cell electrode material or rings 82, 84. Conductive material 90, e.g. conductively doped polysilicon, is formed within openings 88 and preferably electrically interconnects at least some of the isolated individual cell electrodes. Material 90 can be planarized to have a generally planar upper surface which is coplanar with the upper surface of material 86.

Alternately considered, formation of openings 88 constitutes etching a plurality of trenches into the third insulative material and exposing isolated individual cell electrodes. Subsequently, conductive material 90 is formed over the substrate and fills the trenches. Such constitutes second electrically interconnecting some of the isolated cell electrodes with conductive material. By "second electrically interconnecting" is meant that initially, when the cell electrode layer is blanket deposited over the substrate, the cell electrodes for the individual storage capacitors can be considered as being first electrically interconnected. When the conductive material of the cell electrode layer is removed from between the columns of arranged storage capacitors, such can be considered as electrically disconnecting the cell electrodes for the individual storage capacitors. Hence, when conductive material 90 is formed over the selected, isolated cell electrode material, such can be considered as electrically interconnecting some of the cell electrode material for a second time thereby placing them into electrical communication with one another.

Conductive material 92 is subsequently formed over the substrate and patterned into conductive lines which extend to outside circuitry. Exemplary outside circuitry includes sensing circuitry.

Figure 12:
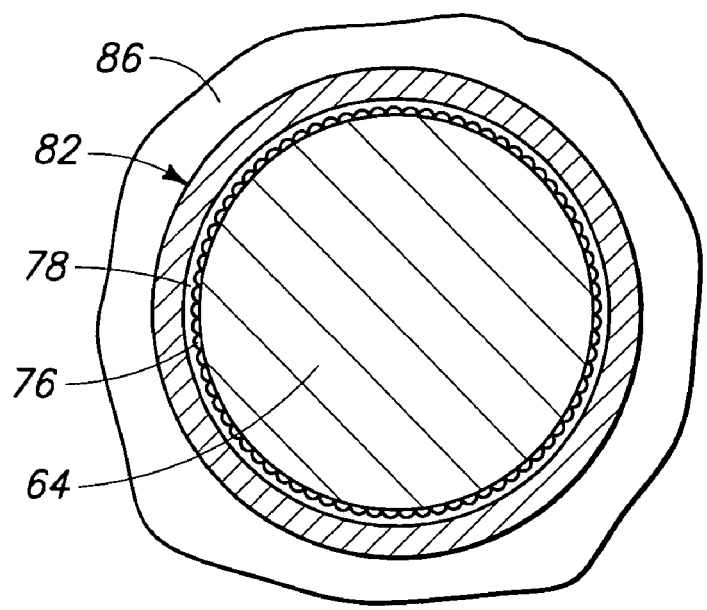
FIG. 12 is a view taken along line 12—12 in FIG. 11.

Referring to FIGS. 11 and 12, integrated circuitry is provided. In one embodiment, a capacitor storage node is provided and includes an uppermost surface 66a and a side surface 66b joined therewith. A protective cap 70 is provided over uppermost surface 66a, and a capacitor dielectric layer 78 is disposed over side surface 66b. A cell electrode band 82 is disposed proximate at least a portion of storage node side surface 66b, and not over storage node uppermost surface 66a. Protective cap 70 has a side surface (not specifically designated), and in one embodiment, cell electrode band 82 is disposed laterally proximate at least a portion of the protective cap side surface. In another embodiment, cell electrode band 82 is disposed over less than an entirety of storage node side surface 66b. In yet another embodiment, cell electrode band 82 has an uppermost portion which extends elevationally higher than any material of capacitor storage node 66.

In another embodiment, integrated circuitry includes a capacitor storage node 66 having an uppermost surface 66a. An insulative material 70 overlies uppermost surface 66a. A capacitor dielectric functioning region which is discrete from overlying insulative material 70 is disposed operably proximate at least a portion of the capacitor storage node. A cell electrode layer 82 is disposed laterally proximate the capacitor dielectric functioning region and overlying insulative material 70. In one embodiment, a substantial portion of the dielectric functioning region is disposed only laterally proximate the capacitor storage node. In another embodiment, the dielectric functioning region comprises a layer of dielectric material 78 which extends over overlying insulative material 70 and defines a non-dielectric functioning region. In another embodiment, the dielectric functioning region defines a band of dielectric material (FIG. 12) which laterally encircles at least a portion of storage node 66. In yet another embodiment, cell electrode layer 82 defines a band of conductive material which laterally encircles at least a portion of storage node 66. In yet another embodiment, cell electrode layer 82 comprises an uppermost band portion which extends elevationally higher than storage node uppermost surface 66a.

In another embodiment, a capacitor-over-bit line memory array is provided and includes a substrate 22 having a pair of spaced-apart conductive lines 26, 28 disposed thereover. A pair of diffusion regions 42, 46 are received within substrate 22 operably proximate conductive lines 26, 28. Conductive material 54 is disposed over and in electrical communication with diffusion regions 26, 28 respectively, and extends away therefrom. A pair of capacitor storage nodes 66, 68 are provided, each of which is operably joined with and in electrical communication with a respective one of the diffusion regions through the conductive material disposed thereover. Each storage node has an uppermost surface 66a, 68a respectively, and a respective side surface 66b, 68b joined therewith. A protective cap 70 is provided over each uppermost surface 66a, 68a, and a capacitor dielectric layer 78 is disposed over each side surface 66b, 68b. Cell electrode bands 82, 84 are respectively disposed proximate at least a portion of each associated storage node side surface 66b, 68b respectively, and not over the associated storage node uppermost surface 66a, 68a. The capacitor-over-bit line circuitry just described can have any of the constructions discussed above.

Figure 13:
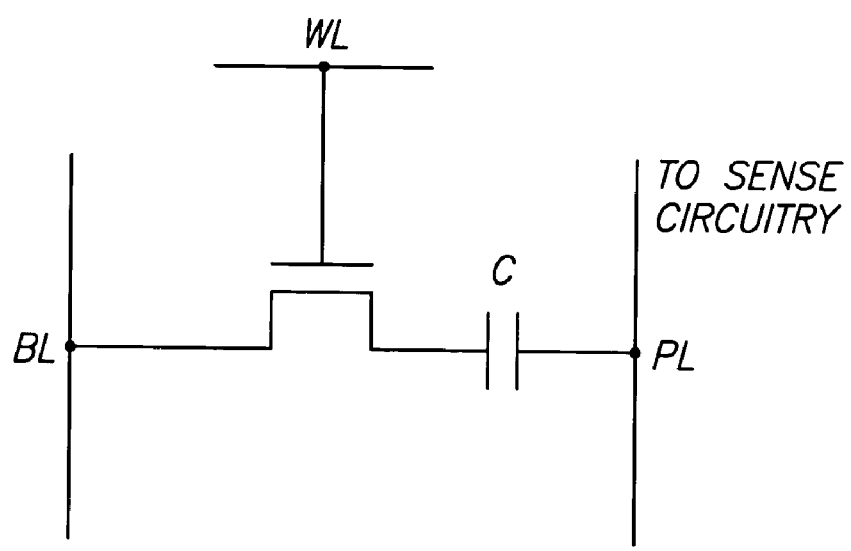
FIG. 13 is a schematic circuit diagram of electronic circuitry formed in accordance with the inventive methodologies.

Referring to FIG. 13, a circuit schematic is shown which depicts a DRAM cell having an access transistor, a bit line BL, a storage capacitor C, and a segmented field plate column line PL. In a preferred embodiment, the segmented field plate column line PL is defined by either or both of conductive materials 90, 92 (FIG. 11). Whereas in the past, the field plate or cell electrode was shared by all of the capacitors in the memory array of a DRAM, the present invention provides methods by which discrete columns of capacitors can be connected into columns which can be selectively used, individually and directly in sensing applications.

Advantages can also be achieved in improving the voltage swing across the capacitors in the memory array and in improving the differential voltage signal as compared with the differential signal produced by an array having a common shared cell plate layer. Other advantages will be apparent to the skilled artisan.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of manufacturing a semiconductor device having capacitors thereon, comprising the steps of:

forming first and second capacitor electrodes supported by a semiconductor substrate, each said capacitor electrode having a portion extending vertically relative to said substrate, said first and second capacitor electrodes being electrically isolated from each other;

forming a first dielectric layer extending over at least a portion of both of said first and second capacitor electrodes, said first dielectric layer extending over at least an uppermost portion of each of said first and second capacitor electrodes;

forming a conductive layer extending over said first dielectric layer and above said first and second capacitor electrodes;

selectively removing selected portions of said conductive layer to expose a first portion of said first dielectric layer relatively proximate said substrate, and to expose second and third portions of said first dielectric layer relatively remote from said substrate, and to electrically isolate sections of said conductive layer to form a third capacitor electrode in contact with a portion of said first dielectric layer proximate said first capacitor electrode, and a fourth capacitor electrode in contact with a portion of said first dielectric layer proximate said second capacitor electrode, said third and fourth capacitor electrodes forming cell electrodes of respective first and second capacitors and being electrically isolated from one another;

forming a second dielectric layer over said exposed portions of said first dielectric layer and over said third and fourth capacitor electrodes; and further comprising forming a bit line elevationally below the first, second, third and fourth capacitor electrodes and elevationally below the first and second dielectric layers.

2. The method of claim 1, further comprising the step of forming a conductive line extending through said second dielectric layer and contacting said third and fourth capacitor electrodes to establish electrical communication between said capacitor electrodes.

3. The method of claim 1, wherein said second dielectric layer is in contact with said first dielectric layer and with said third and fourth capacitor electrodes.

4. The method of claim 1, wherein said second and third portions of said first dielectric layer comprise an uppermost portion of said capacitors.

5. The method of claim 1, wherein said second and third portions of said first dielectric layer are spaced apart from respective said first and second capacitor electrodes.

* * * * *

UNITED STATES PATENT AND TRADEMARK OFFICE
CERTIFICATE OF CORRECTION

PATENT NO.         : 6,995,059 B2
APPLICATION NO. : 10/627468
DATED              : February 7, 2006
INVENTOR(S)        : Lowrey et al.

Page 1 of 1

It is certified that error appears in the above-identified patent and that said Letters Patent is hereby corrected as shown below:

Title page, item [75] Inventors:, please delete "Mark Durcan" after "Alan R. Reinberg" and insert --D. Mark Durcan--.

Signed and Sealed this

First Day of May, 2007

JON W. DUDAS
*Director of the United States Patent and Trademark Office*